(12) United States Patent
Jensen et al.

(10) Patent No.: US 8,259,953 B2
(45) Date of Patent: Sep. 4, 2012

(54) THERMAL PROTECTION OF ELECTRO DYNAMIC TRANSDUCERS USED IN LOUDSPEAKER SYSTEMS

(75) Inventors: Bjørn Sand Jensen, Nærum (DK); Mads Emil Solgaard, Lyngby (DK)

(73) Assignee: Bang & Olufsen Icepower A/S, Struer (DK)

( * ) Notice: Subject to any disclaimer, the term of this patent is extended or adjusted under 35 U.S.C. 154(b) by 489 days.

(21) Appl. No.: 12/385,528

(22) Filed: Apr. 10, 2009

(65) Prior Publication Data

US 2009/0257599 A1    Oct. 15, 2009

(30) Foreign Application Priority Data

Apr. 10, 2008  (DK) .................................. 2008 00527

(51) Int. Cl.
*H03G 11/00* (2006.01)
(52) U.S. Cl. .......................................... 381/55; 381/397
(58) Field of Classification Search .................... 381/55, 381/56, 58, 59, 96, 116, 397
See application file for complete search history.

(56) References Cited

U.S. PATENT DOCUMENTS

| 2004/0178852 A1* | 9/2004 | Neunaber ....................... 330/284 |
| 2005/0031132 A1* | 2/2005 | Browning et al. ............... 381/59 |
| 2007/0057720 A1* | 3/2007 | Hand et al. ....................... 330/10 |

\* cited by examiner

*Primary Examiner* — Minh-Loan T Tran
*Assistant Examiner* — Fazli Erdem
(74) *Attorney, Agent, or Firm* — Harness, Dickey & Pierce, P.L.C.

(57) ABSTRACT

Electro dynamic transducers can fail due to either excessive voice coil excursion, causing mechanical clipping, or by overheating of the voice coil causing degradation of the materials. The disclosed invention relates to protection against excess voice coil temperature in such transducers. The current through the transducer voice coil and the voltage across its terminals, are measured. The resistive part of the impedance of the transducer is then estimated based on the measurements of current and voltage. When the resistive impedance for the given type of transducer is well known at one temperature it is then possible to calculate the temperature when the resistive impedance changes. The estimated voice coil temperature is then fed to a signal attenuator or controller, which attenuates the output signal to the transducer.

13 Claims, 1 Drawing Sheet

THERMAL PROTECTION OF ELECTRO DYNAMIC TRANSDUCERS USED IN LOUDSPEAKER SYSTEMS

PRIORITY STATEMENT

This application claims the benefit of Danish Patent Application No. 2008 00527, filed on Apr. 10, 2008, in the Danish Patent and Trademark Office, the disclosure of which is incorporated herein in its entirety by reference.

TECHNICAL FIELD OF THE INVENTION

The present invention relates to protection against excess voice coil temperature in loudspeaker transducers.

In standard loudspeaker systems electro dynamic transducers can fail due to overheating of the voice coil causing degradation of the materials. The present invention relates to improvements in that respect.

BACKGROUND OF THE INVENTION

It has been known since the 1970's that overheating of the voice coil of electro dynamic transducers is one of the main causes of failure of such transducers. Therefore, transducer manufacturers normally specify a maximum power rating, which they can guarantee that the transducer will survive being exposed to for an extended period of time. However, music is very dynamic, which means that such a static limit is far from optimal, because the transducers can handle much more power than the maximum power rating for shorter periods of time. Therefore different systems for thermal protection of transducers have been researched since the late 1970's. With such a system it would not be possible to damage the transducer even though more power than the maximum rated power is applied for shorter periods of time. However, as of today such protection systems have not seen widespread commercial use.

Previous thermal protection systems can be divided into three categories:

1) Feed forward protection systems, where the voice coil temperature is predicted using a thermal transducer model. The signal is then attenuated based on the predicted temperature. Such systems are very susceptible to modeling inaccuracies, as well as the fact that the ambient temperature is a very important parameter for the temperature prediction model. This means that either a given ambient temperature is assumed, which can be inaccurate, or an ambient temperature sensor is required, which increases the complexity and adds cost.

2) Feedback systems, where the temperature is measured in one way or another. Typically, since the voice coil is moving, it is difficult to attach a temperature sensor directly to the voice coil. Therefore, in such systems, the temperature of the transducer magnet can be measured instead and then a thermal model can be used to predict the voice coil temperature based on the magnet temperature. The signal is then attenuated based on the measured or predicted temperature. The disadvantages of such a system are first, the addition of a temperature sensor, which increases the overall system cost. Second the system is sensitive to modeling inaccuracies.

3) Systems where a DC component is added to the audio signal. The DC-resistance of the voice coil can then be calculated by low pass filtering the signal and using Ohms law to calculate the DC-resistance. Since there is a linear relationship between temperature and resistance of an electrically conducting material, the voice coil temperature can be calculated based on its DC-resistance. The signal is then attenuated based on the calculated temperature. The disadvantages of this type of system are that the constant DC in the signal will produce a slight offset of the transducer diaphragm, which decreases the linearity of the transducer. Furthermore the constant DC will dissipate power in the voice coil, increasing idle power consumption of the system and heating up the voice coil unnecessarily. There is also the technical problem that most power amplifiers are AC-coupled by nature, which means that they are incapable of reproducing DC signals.

US 2004/0178852 discloses a system where voltage across the voice coil, and current through the voice coil are measured, and used to calculate the DC resistance of the voice coil. The resistance is then used to determine the temperature, so as to enable attenuation of the input.

GENERAL DISCLOSURE OF THE INVENTION

It is an object of the present invention to overcome, or at least ameliorate, at least some of the problems associated with conventional approaches for thermal protection in loudspeakers.

According to a first aspect of the present invention, this and other objects are achieved by a method for protecting an electro dynamic transducer against thermal overload of a voice coil comprised in the transducer, comprising detecting a current through the voice coil, estimating a resistive part of a voice coil impedance, based on the detected current, and attenuating an output power supplied to the transducer based on the estimated resistive value of the voice coil impedance.

According to a second aspect of the present invention, this and other objects are achieved by a loud speaker system, comprising at least one transducer comprising an electro dynamic transducer including a voice coil, a detector for detecting a current through the voice coil, circuitry for estimating a resistive part of a voice coil impedance, based on the detected current, and an attenuator, connected to the transducer and arranged to attenuate an output power supplied to the transducer based on said estimated resistive part of the voice coil impedance, in order to protect the transducer against thermal overload.

According to these aspects of the invention, the resistive part of the impedance of the transducer can be estimated based on detected values of current through the voice coil. The temperature of the voice coil can then be determined based on a relationship between resistance and temperature for a given type of transducer. The output signal to the transducer is then attenuated based on the estimated resistance, and (implicitly) the temperature that it represents.

Thermal protection according to the present invention overcomes various problems of the prior art, because it does not require knowledge of the ambient temperature, it does not require any temperature sensor and it does not add any DC component to the audio signal.

In this document the term transducer will be used with reference to a single electro dynamic transducer for reproducing sound. The term loudspeaker will be used with reference to an assembly of one or more transducers in some form of cabinet which can be an acoustically closed box, a vented or bass reflex box or an acoustic horn.

The estimation of the resistive part of the voice coil impedance can be based on the measured current through the transducer voice coil and a prediction of the voltage across the transducer terminals, based on knowledge of the audio signal and the gain factor of the audio amplifier.

Alternatively, the estimation of the resistive part of the voice coil impedance can be based on the measured current through the transducer voice coil and the measured voltage across the transducer terminals.

The measuring of the current can be performed using a voltage detection means detecting the voltage across a precision resistor connected between the output of the power amplifier and the transducer voice coil or between the voice coil and the ground terminal. The voltage detection means is executed by an Analog to Digital Converter or a similar technology.

The estimation of the resistive part of the transducer voice coil impedance is preferably performed in real time by a digital controller, based on said measurement of voltage and current in the transducer voice coil.

The transducer resistive impedance estimation can be an adaptive parameter identification algorithm for updating a parameterized discrete time model of the transducer where the resistive part of the transducer impedance is an explicit parameter of the model; and where the parameterized discrete time transducer model is a model of either an electro dynamic transducer in free air, in a closed cabinet or in a bass reflex cabinet.

An algorithm for transducer resistive impedance estimation may consist of the following steps:

a) An optional procedure, where the signal is conditioned using filtering as well as removing sample pairs of the instantaneous values of voltage and current, where the current is below a certain threshold value;

b) A procedure based on a model of the transducer, which is a discrete time difference equation describing the relationship between current and previous values of voltage and current, in which the resistive part of the impedance is an explicit parameter; and where the instantaneous value of the resistive part of the impedance is calculated by rearranging the difference equation, to isolate the resistive part of the impedance; and where the resistive part of the impedance is then calculated based on the measurement of current and previous values of the current and voltage;

c) An optional procedure, where the estimated resistance from step b) is passed through a low pass filter to reduce noise in the estimate.

The discrete time transducer model can be a model of either a transducer in free air, in a closed box or in a vented or in a bass reflex cabinet.

BRIEF DESCRIPTION OF THE DRAWINGS

These and other aspects of the present invention will now be described in more detail, with reference to the appended drawings showing a currently preferred embodiment of the invention.

DETAILED DESCRIPTION OF EMBODIMENTS OF THE INVENTION

Figure 1:
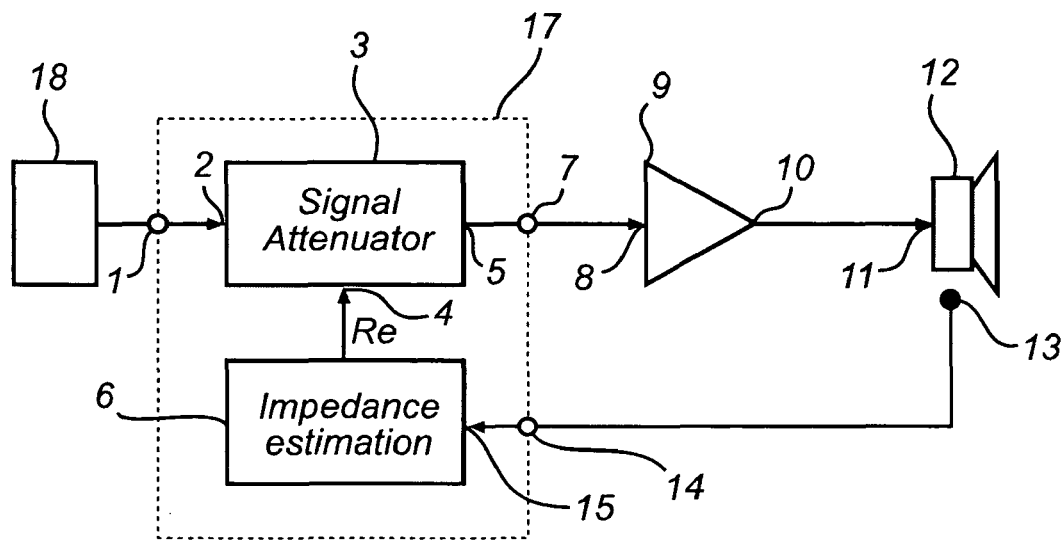
FIG. 1 shows a block diagram of a thermal protection system according to an embodiment of the invention.

FIG. 1 shows a thermal protection system 17 intended to be used together with an audio power amplifier 9, and an electro dynamic transducer 12. The protection system 17 comprises an impedance estimator 6, and an attenuator 3. The thermal protection system may be implemented as a digital controller, e.g. a micro processor or a digital signal processor, arranged to execute a thermal protection algorithm to be described below.

In a preferred embodiment the input 1 of the thermal protection system 17 is connected to a digital audio signal source 18. The input 1 is then connected to the signal attenuator 3, performing an attenuation function based on an estimated value of the electrical resistance ($R_e$) of the electro dynamic transducer 12, determined by the estimator 6.

The output 5 of the signal attenuator 3 is connected through the output 7 of the protection system 17 to the input 8 of an audio power amplifier 9. The output 10 of the audio power amplifier is connected to the terminals 11 of the electro dynamic transducer 12.

The current through the voice coil of the electro dynamic transducer, as well as possibly also the voltage across its terminals, are measured by a measurement system 13 and fed to an Analogue to Digital Converter 14, connected to the input 15 of the impedance estimator 6.

The impedance estimator 6 estimates the resistive part of the impedance of the transducer $R_e$. The output of the impedance estimation means 6 is the estimated resistance $R_e$ of the voice coil, which is connected to a second input 4 of the signal attenuation means 3.

Figure 2:
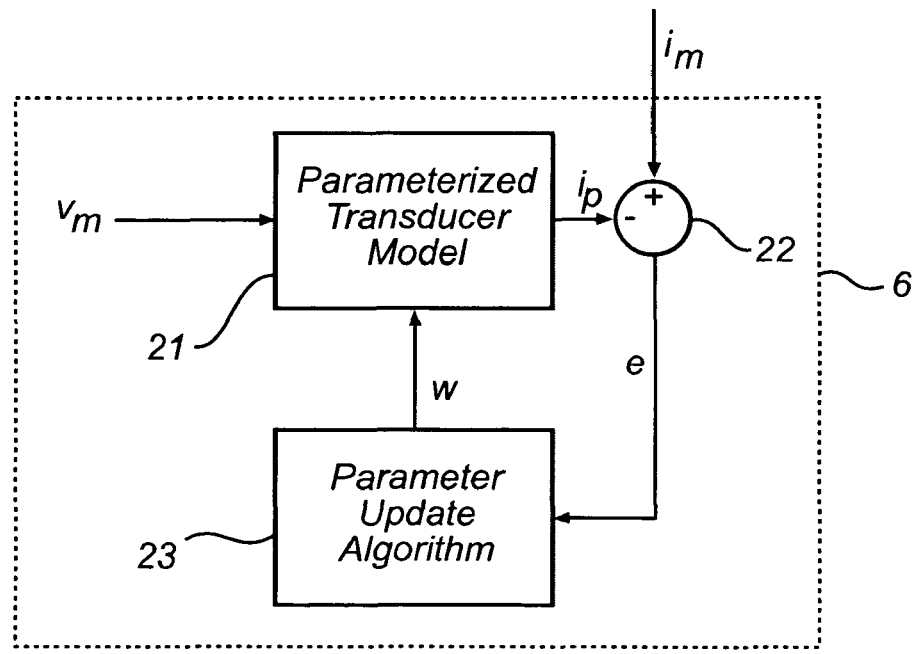
FIG. 2 shows an example of an adaptive parameter identification system according to an embodiment of the present invention.

FIG. 2 shows an example of the impedance estimator 6, in which an adaptive parameter identification algorithm is used for updating a parameterized discrete time model of the transducer including its acoustical enclosure, where $R_e$ is an explicit parameter of the model.

The estimator 6 comprises a discrete time parameterized model 21 of the transducer 12, where the parameters are described by the parameter vector w, where $R_e$ is one of the elements of w, and an update algorithm 23 for updating the parameters of the model. This is the general concept of an adaptive parameter identification algorithm. The parameterized transducer model 21 can be structured in different ways.

The version shown in FIG. 2 is a current-based version, where the measured voltage $v_m$ is connected to the discrete time parameterized transducer model 21. The model provides a prediction of the current $i_p$ through the transducer voice coil, calculated based on the parameter vector w. The predicted current $i_p$ is then connected to one input of a summation element 22, whose second input is connected to the measured current $i_m$ through the transducer voice coil. The error output e from the summation element 22 is the difference between $i_p$ and $i_m$. The error e is then connected to the parameter update algorithm 23, which outputs the updated parameter vector w, which is updated according to the error signal e. The updated parameter vector w is then fed back to the transducer model 21.

Those skilled in the art of Digital Signal Processing and modeling of electro dynamic transducers will know how to derive the above mentioned discrete time parameterized transducer model 21 including its acoustical enclosure, where $R_e$ is an explicit parameter. Such models are well described in the literature.

The parameter update algorithm 23 updates the parameter vector w in discrete steps according to an update rule and the error signal e. The update rule can be a number of different known algorithms, such as LMS, NLMS, RLS or an ad-hoc update rule. Those skilled in the art of adaptive filters and Digital Signal Processing will be familiar with those techniques and will know how to derive the update rules, based on the structure of the discrete time parameterized transducer model. Those algorithms are well described in the literature.

In a second embodiment a three step method as described below is used for estimating the resistive part of the voice coil impedance. Steps 1 and 3 are optional:

1) Signal Conditioning of the Detected Current and Voltage:

The signal conditioning can consist of both filtering as well as thresholding of the instantaneous value pairs of voltage, $v_m[n]$, and current, $i_m[n]$, such that sample pairs where $i_m[n]$ is below a certain threshold $i_{m,th}$ are removed. Filtering and thresholding are techniques which are familiar to a person skilled in the art of Digital Signal Processing.

2) Estimating the Instantaneous Resistive Part of the Impedance:

This step is performed based on a model of the transducer, which is a discrete time difference equation describing the relationship between current and previous values of voltage and current, in which the resistive part of the impedance is an explicit parameter.

The instantaneous value of the resistive part of the impedance is calculated by rearranging the difference equation, to isolate the resistive part of the impedance.

The resistive part of the impedance is then calculated based on the measurement of current and previous values of the current and voltage. The resulting algorithm, for a simple transducer in a closed box, where the voice coil is described simply as a resistor looks like:

$$F_c[n] = Bl \cdot i_m[n]$$
$$u[n] = \sigma(F_c[n] - F_c[n-2]) - a_1 u[n-1] - a_2 u[n-2]$$
$$R_e[n] = \frac{1}{i_m[n]} \cdot (v_m[n] - Bl \cdot u[n])$$

Where $F_c[n]$ is the Lorentz force acting on the voice coil, due to the current $i_m[n]$ in the magnetic field caused by the magnet of the transducer. Bl is a proportional factor relating the voice coil current to force the Fc. Here, u[n] is the velocity of the diaphragm and voice coil assembly, $R_e[n]$ is the resistive part of the voice coil impedance. a1, a2 and σ are filter coefficients related to the mechanical properties of the transducer.

3) Filtering the Instantaneous Estimate:

The instantaneous estimated resistance $R_e$ from step 2) is passed through a low pass filter to reduce noise in the estimate. Low pass filtering techniques are well known to a person skilled in the art of Digital Signal Processing.

The signal attenuator 3 in FIG. 1 reduces the heating of the voice coil by attenuating the output signal to the loudspeaker. The attenuation is performed based on the estimated $R_e$ as described below.

The relationship between resistance and temperature for an electrically conducting material is well known:

$$R_2 = R_1*(T_2-T_1)*C+R_1$$

where $(R_1, T_1)$ is a reference point, which is well known for the particular type of loudspeaker transducer. $R_2$ is then the resistance at the temperature $T_2$. C is the temperature gradient of the voice coil material.

For a particular type of loudspeaker the maximum allowable voice coil temperature $T_{max}$ is known when designing a particular loudspeaker system, using the protection system.

The maximum allowable voice coil resistance $R_{e,\ max}$ can therefore be calculated off-line.

There are different ways of attenuating the signal based on the estimated resistance $R_e$.

The attenuation of the output power to the transducer can be performed by multiplying the audio signal with an adjustable gain factor g, adjusted according to:

g=1, $R_e<R_{e,\ threshold}$
g=f($R_e$), $R_{e,\ threshold}<R_e<R_{e,\ max}$
g=0, $R_e>R_{e,\ max}$, where f can be any linear or non linear static or dynamic function, attaining values between 0 and 1 in the interval $R_{e,\ threshold}<R_e<R_{e,\ max}$.

In addition, the attenuation of the output power to the transducer i can be performed by filtering the audio signal with a high pass filter with an adjustable cut-off frequency F, where F is varied according to:

F=$F_0$, $R_e<R_{e,\ threshold}$
F=f($R_e$), $R_{e,\ threshold}<R_e<R_{e,\ max}$
F=$F_{Max}$, $R_e>R_{e,\ max}$ where f can be any linear or non linear static or dynamic function attaining values between $F_0$ and $F_{max}$ in the interval $R_{e,\ threshold}<R_e<R_{e,\ max}$.

In the preferred embodiment the approach is to use a two-way approach, consisting of:

1) A High Pass filter with a variable cut-off frequency F which is adjusted according to $R_e$.

2) A variable gain g, which is adjusted according to $R_e$.

According to this approach, when $R_e$ increases above a certain threshold $R_{e,th1}$, the cut off frequency F of the high pass filter is adjusted upwards in order to filter out low frequency components.

If $R_e$ continues to rise, then at a second threshold $R_{e,th2}$ the global gain g is gradually adjusted downwards, effectively establishing a sort of closed loop feedback system.

The invention may be applied in any type of loudspeaker system that includes one or more transducer units to protect the one or more transducer units.

This includes active speaker systems e.g. in, but not limited to: PC's laptops, cell phones, media players, Audio/Video systems, PDA's, and PC screens.

What is claimed is:

1. A method for protecting an electro dynamic transducer against thermal overload of a voice coil provided in the transducer, comprising:
   detecting a current through the voice coil,
   estimating a resistive part of a voice coil impedance, based on the detected current, and
   attenuating an output power supplied to the transducer based on said estimated resistive part of the voice coil impedance,
   wherein the estimation of the resistive part of the transducer impedance includes:
   creating a set of sample pairs of detected values of current through the transducer voice coil and voltage across the transducer voice coil,
   defining a model of the transducer, said model being a discrete time difference equation describing a relationship between voltage and current in the transducer, in which the resistive part of the impedance is an explicit parameter,
   rearranging the discrete time difference equation to isolate the resistive part of the impedance,
   calculating the resistive part of the impedance based on said set of sample pairs of detected values and said model of the transducer, and
   low pass filtering the calculated value of the resistive part of the impedance.

2. The method according to claim 1, where the estimation of the resistive value of the voice coil impedance is based on the detected current through the transducer voice coil and a prediction of the voltage across the transducer, based on knowledge of the audio signal and the gain factor of the audio amplifier.

3. The method according to claim 1, further comprising detecting a voltage across the transducer, and where the estimation of the resistive value of the voice coil impedance is based on the detected current through the transducer voice coil and the detected voltage across the transducer.

4. The method according to claim 1, where the current is detected by detecting a voltage across a resistor connected between the transducer voice coil and an output of a power amplifier preceding the transducer.

5. The method according to claim 1, where the current is detected by detecting a voltage across a resistor connected between the transducer voice coil and the ground terminal.

6. The method according to claim 1, where the estimation of the resistive part of the transducer voice coil impedance is performed in real time in a digital controller, based on the detection of current through the transducer voice coil.

7. The method according to claim 1, where the estimation of the resistive part of the transducer impedance is performed using an adaptive parameter identification algorithm for updating a parameterized discrete time model of the transducer, wherein the resistive part of the transducer impedance is an explicit parameter of the model.

8. The method according to claim 7, where the parameterized discrete time transducer model is a model of an electro dynamic transducer in one of free air, a closed cabinet and a bass reflex cabinet.

9. The method according to claim 1, further comprising removing sample pairs where the current value is below a certain threshold.

10. The method according to claim 1, where said model is a model of a transducer in one of free air, a closed box, and a bass reflex cabinet.

11. The method according to claim 1, where attenuating the output power supplied to the transducer is performed by multiplying an audio signal supplied to the transducer with an adjustable gain factor g, adjusted according to:
 a. $g=1$, for $R_e < R_{e, threshold}$
 b. $g=f(R_e)$, for $R_{e, threshold} < R_e < R_{e, max}$
 c. $g=0$, for $R_e > R_{e, max}$, where f is a function attaining values between 0 and 1 in the range $R_{e, threshold} < R_e < R_{e, max}$.

12. The method according to claim 1, where attenuating the output power supplied to the transducer is performed by high pass filtering an audio signal supplied to the transducer with an adjustable cut-off frequency F, where F is varied according to:
 a. $F=F_0$, $R_{e < Re, threshold}$
 b. $F=f(Re)$, $R_{e, threshold < Re} < R_{e, max}$
 c. $F=F_{Max}$, $R_e > R_{e, max}$
where f is a function attaining values between $F_0$ and $F_{max}$ in the interval $R_{e, threshold} < R_e < R_{e, max}$.

13. A loud speaker system, comprising:
 at least one transducer, including an electro dynamic transducer having a voice coil,
 a detector for detecting a current through the voice coil,
 circuitry for estimating a resistive part of a voice coil impedance, based on the detected current, and
 an attenuator, connected to said transducer and arranged to attenuate an output power supplied to the transducer based on said estimated resistive part of the voice coil impedance, in order to protect said transducer against thermal overload,
 wherein said circuitry for estimating the resistive part is arranged to:
  create a set of sample pairs of detected values of current through the transducer voice coil and voltage across the transducer voice coil,
  define a model of the transducer, said model being a discrete time difference equation describing a relationship between voltage and current in the transducer, in which the resistive part of the impedance is an explicit parameter,
  rearrange the discrete time difference equation to isolate the resistive part of the impedance,
  calculate the resistive part of the impedance based on said set of sample pairs of detected values of current and said model of the transducer; and
  low pass filter the calculated value of the resistive part of the impedance.

* * * * *